US011960209B2

(12) United States Patent
Kai et al.

(10) Patent No.: US 11,960,209 B2
(45) Date of Patent: Apr. 16, 2024

(54) DEVELOPING TREATMENT METHOD AND DEVELOPING TREATMENT APPARATUS

(71) Applicant: Tokyo Electron Limited, Tokyo (JP)

(72) Inventors: Akiko Kai, Koshi (JP); Hiroshi Ichinomiya, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 758 days.

(21) Appl. No.: 16/998,231

(22) Filed: Aug. 20, 2020

(65) Prior Publication Data

US 2021/0063885 A1 Mar. 4, 2021

(30) Foreign Application Priority Data

Sep. 2, 2019 (JP) ................................ 2019-159472

(51) Int. Cl.
*G03F 7/30* (2006.01)

(52) U.S. Cl.
CPC .................................. *G03F 7/3021* (2013.01)

(58) Field of Classification Search
CPC .......... G03F 7/3021; G03F 7/32; G03F 7/322; G03F 7/162
See application file for complete search history.

(56) References Cited

U.S. PATENT DOCUMENTS

2020/0064742 A1* 2/2020 Kai .................. H01L 21/67098

FOREIGN PATENT DOCUMENTS

| | | | |
|---|---|---|---|
| JP | H05-029936 | A | 2/1993 |
| JP | 2018-056553 | A | 4/2018 |
| WO | 2018/116985 | A1 | 6/2018 |

* cited by examiner

*Primary Examiner* — Daborah Chacko-Davis
(74) *Attorney, Agent, or Firm* — POSZ LAW GROUP, PLC

(57) ABSTRACT

A developing treatment method for performing a developing treatment on a resist film on a substrate, includes the following. (A) supplying a developing solution to the substrate and developing the resist film to form a resist pattern; (B) supplying a water-based cleaning liquid to the developed substrate to clean the substrate with the water-based cleaning liquid; (C) applying an aqueous solution of a water-soluble polymer to the substrate cleaned with the water-based cleaning liquid to form a hydrophilic layer having a hydrophilic property on a surface of the substrate; and (D) cleaning the substrate on which the hydrophilic layer has been formed, with a rinse liquid. (B) includes (a) accelerating a rotation speed of the substrate; and (b) after (a), decelerating the rotation speed of the substrate until a start of (C), wherein a deceleration in (b) is lower than an acceleration in (a).

12 Claims, 8 Drawing Sheets

(A)

(E)

(B)

(F)

(C)

(G)

(D)

(A)

(B)

ROTATION SPEED (rpm)
HRS2
RS
HRS1
0
0
50
TIME (sec)
S3
S3a
S3b
S4
S4a
S4b
S10
S10a
S10b
S10b1
S10b2

DEVELOPING TREATMENT METHOD AND DEVELOPING TREATMENT APPARATUS

CROSS REFERENCE TO RELATED APPLICATIONS

This application is based upon and claims the benefit of priority of the prior Japanese Patent Application No. 2019-159472, filed in Japan on Sep. 2, 2019, the entire contents of which are incorporated herein by reference.

TECHNICAL FIELD

This disclosure relates to a developing treatment method and a developing treatment apparatus.

BACKGROUND

Japanese Laid-open Patent Publication No. H05-29936 discloses that two or more types of rinse liquids are used in a rinse process in developing the resist pattern in order to prevent the occurrence of a pattern collapse in forming a line-and-space resist pattern. The method disclosed in Japanese Laid-open Patent Publication No. H05-29936 exposes the resist surface which has been subjected to the treatment with the developing solution, to the rinse liquid used in the first half process of a rinse process so as to promote the improvement of the quality of the resist surface, thereby adjusting a contact angle between the rinse liquid to be used in the second half process and the resist surface to a desired angle.

SUMMARY

An aspect of this disclosure is a developing treatment method for performing a developing treatment on a resist film on a substrate, including: (A) supplying a developing solution to the substrate and developing the resist film to form a resist pattern; (B) supplying a water-based cleaning liquid to the developed substrate to clean the substrate with the water-based cleaning liquid; (C) applying an aqueous solution of a water-soluble polymer to the substrate cleaned with the water-based cleaning liquid to form a hydrophilic layer having a hydrophilic property on a surface of the substrate; and (D) cleaning the substrate on which the hydrophilic layer has been formed, with a rinse liquid, the (B) including: (a) accelerating a rotation speed of the substrate; and (b) after the (a), decelerating the rotation speed of the substrate until a start of the (C), wherein a deceleration in the (b) is lower than an acceleration in the (a).

DETAILED DESCRIPTION

Figure 1:
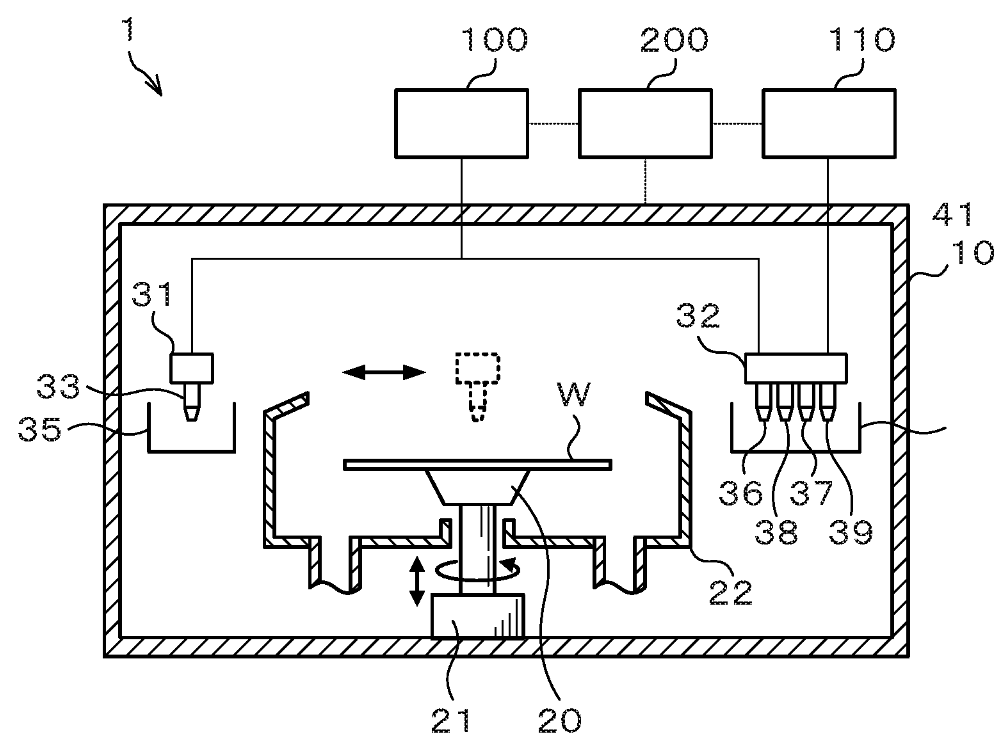
FIG. 1 is a longitudinal sectional view illustrating the outline of a configuration of a developing treatment apparatus according to a first embodiment.

In a photolithography process in a manufacturing process of a semiconductor device and the like, a series of treatments are performed to form a predetermined resist pattern on a semiconductor wafer (hereinafter, referred to as a “wafer”). The series of treatments include, for example, a resist coating treatment of supplying a resist solution onto the wafer to form a resist film, exposure processing of exposing the resist film, and a developing treatment of supplying a developing solution to the exposed resist film to develop the exposed resist film.

In the above developing treatment, for example, the developing solution is supplied onto the wafer to form a solution film of the developing solution on the wafer surface, thereby developing the wafer. Thereafter, a cleaning liquid such as pure water is supplied onto the wafer, and the wafer is rotated at high speed and thereby cleaned. This cleaning removes a dissolution product generated in the developing solution on the wafer during the development.

Incidentally, with the advance in the exposure technology and the like, miniaturization of semiconductor devices further proceeds in recent years, and a resist pattern that is fine and high in aspect ratio appears. In the fine resist pattern and the resist pattern high in aspect ratio, if the cleaning liquid remains on the wafer during the above development, a problem is brought about. For example, in the case where the resist pattern is the line-and-space pattern, when the cleaning liquid remains between patterns, the remaining cleaning liquid causes a so-called pattern collapse.

Japanese Laid-open Patent Publication No. H05-29936 discloses that in a rinse process of cleaning with a rinse liquid in developing the resist pattern, two or more types of rinse liquids are used in order to prevent the occurrence of the pattern collapse of the line-and-space pattern as explained above. The method disclosed in Japanese Laid-open Patent Publication No. H05-29936 exposes the resist surface which has been subjected to the treatment with the developing solution, to the rinse liquid to be used in the first half process of the rinse process so as to promote improvement of quality of the resist surface, thereby adjusting a contact angle between the rinse liquid to be used in the second half process and the resist surface to a desired angle.

Note that a stress σ generated in the rinse liquid remaining between the patterns, namely, a force in a direction parallel to the substrate generated in the patterns by the cleaning liquid remaining between the patterns is in the following relation with a contact angle θ of the resist film with respect to the rinse liquid and a surface tension γ of the cleaning liquid.

$$\sigma \propto \gamma \cos\theta \quad \text{(Expression 1)}$$

Incidentally, a material high in water repellency is used as the material of the resist film in some cases.

However, the technique of Japanese Laid-open Patent Publication No. H05-29936 is a technique relating to a resist film having a contact angle with water as the cleaning liquid of 0°, namely, a resist film low in water repellency.

Besides, even if using a resist film high in water repellency, when advancing miniaturization, the pattern collapse occurs when the rinse liquid remains between the patterns of the line-and-space pattern during the development.

Further, if the rinse liquid remains between the patterns, namely, on the wafer, the dissolution product contained in the rinse liquid will also remain on the wafer. The dissolution product remaining on the wafer causes defects. The defect caused from the dissolution product remaining on the wafer is a problem in common for the case where the resist pattern is other than the line-and-space pattern (for example, in the case of a hole pattern and a pillar pattern), and is a problem irrespective of the density of the patterns, namely, irrespective of the number of recesses and projections of the patterns existing in a certain area.

Hence, the technique according to this disclosure decreases the number of defects in the case of using a resist film high in water repellency, namely, the number of defects in the case of forming a resist film having a large contact angle with a rinse liquid.

Hereinafter, a developing treatment method and a developing treatment apparatus according to embodiments will be explained referring to the drawings. Note that the same codes are given to components having substantially the same functional configurations in the description and the drawings to omit duplicated explanation.

First Embodiment

Figure 2:
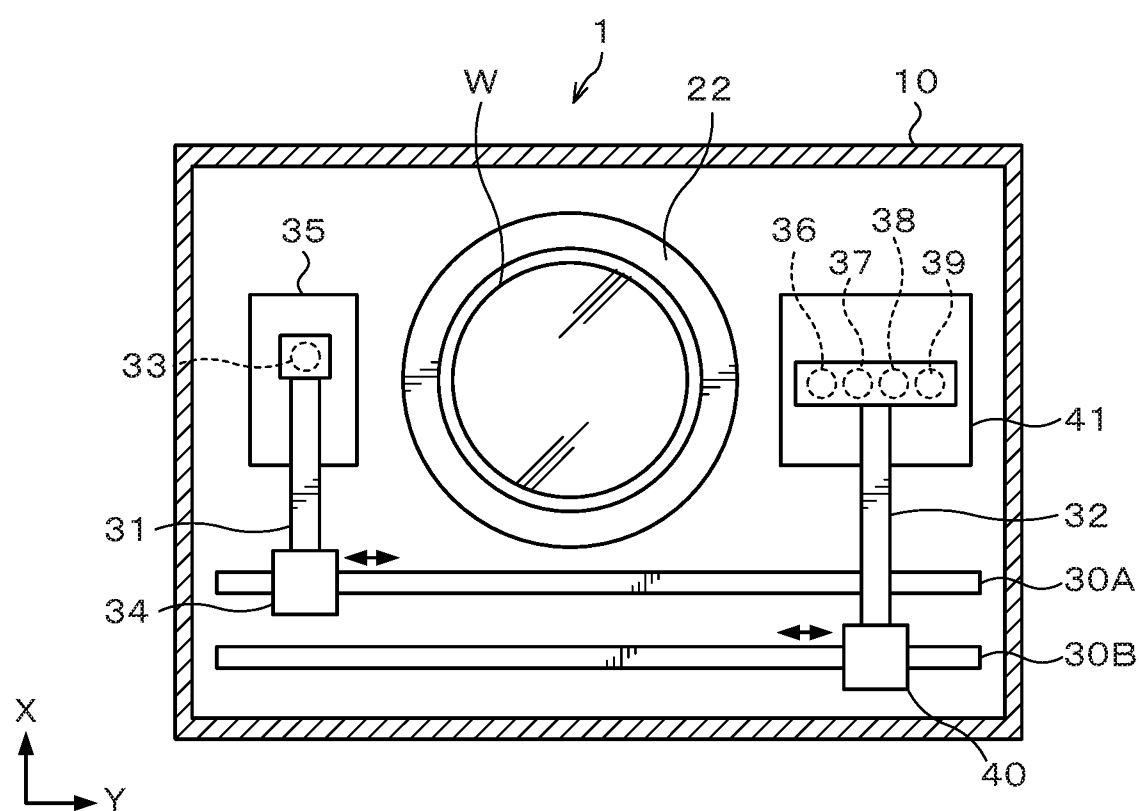
FIG. 2 is a transverse sectional view illustrating the outline of the configuration of the developing treatment apparatus according to the first embodiment.

FIG. 1 and FIG. 2 are a longitudinal sectional view and a transverse sectional view illustrating the outline of a configuration of a developing treatment apparatus 1 according to a first embodiment.

The developing treatment apparatus 1 has a treatment container 10 whose inside is sealable as illustrated in FIG. 1. A side surface of the treatment container 10 is formed with a transfer-in/out port (not illustrated) for a wafer W as a substrate.

In the treatment container 10, a spin chuck 20 is provided which holds the wafer W and rotates it around a vertical axis. The spin chuck 20 is configured to freely rotate at various speeds by a chuck drive 21 (such as a motor) as a rotation mechanism. Further, the chuck drive 21 is provided with a not-illustrated raising and lowering drive mechanism such as a cylinder, so that the spin chuck 20 is configured to be freely raised and lowered by the raising and lowering drive mechanism.

A cup 22 is provided to surround the periphery of the wafer W held by the spin chuck 20. The cup 22 is intended to receive and collect liquid splashing or dropping from the wafer W.

As illustrated in FIG. 2, on an X-direction negative direction (lower direction in FIG. 2) side of the cup 22, rails 30A, 30B extending along a Y-direction (right-left direction in FIG. 2) are formed. The rails 30A, 30B are formed, for example, from a Y-direction negative direction (left direction in FIG. 2) side outer position of the cup 22 to a Y-direction positive direction (right direction in FIG. 2) side outer position. To the rails 30A, 30B, corresponding arms 31, 32 are attached, respectively.

On the first arm 31, a developing solution supply nozzle 33 is supported which supplies a developing solution. The first arm 31 is movable on the rail 30A by a nozzle drive 34 as a moving mechanism. Thus, the developing solution supply nozzle 33 can move from a waiting section 35 provided at a Y-direction negative direction side outer position of the cup 22 to above a central portion of the wafer W in the cup 22. Further, the first arm 31 can freely rise and lower by the nozzle drive 34 and adjust the height of the developing solution supply nozzle 33. As the developing solution, for example, tetramethylammonium hydroxide (TMAH) is used.

On the second arm 32, a DIW supply nozzle 36, an aqueous solution supply nozzle 37, a mixed solution supply nozzle 38, and a gas supply nozzle 39 are supported.

The second arm 32 is movable on the rail 30B by a nozzle drive 40 as a moving mechanism. Thus, the nozzles 36 to 39 can move from a waiting section 41 provided at a Y-direction positive direction side outer position of the cup 22 to above the central portion of the wafer W in the cup 22. Further, the second arm 32 can freely rise and lower by the nozzle drive 40 and adjust the height of the nozzles 36 to 39.

The DIW supply nozzle 36 supplies DIW (Deionized Water). DIW is used as a water-based cleaning liquid and a rinse liquid. In other words, the DIW supply nozzle 36 functions as a cleaning liquid supply nozzle and a rinse liquid supply nozzle.

The aqueous solution supply nozzle 37 supplies an aqueous solution of a water-soluble polymer. The aqueous solution of the water-soluble polymer is for reducing a contact angle, with respect to water, of a resist pattern formed by developing the resist film with the developing solution.

The water-soluble polymer contained in the aqueous solution of the water-soluble polymer is, for example, a homopolymer or a copolymer of a monomer containing a hydrophilic group, a polycondensate having a hydrophilic group, or the like. Concrete examples of the water-soluble polymer include acrylic acid, methacrylic acid, fluoroacrylic acid, perfluoroalkyl acid, vinyl alcohol, vinyl pyrrolidone, acrylic ester, methacrylate ester, polyvinyl alcohol (including partially saponified product), polyacrylic acid, polymethacrylic acid, polyvinylmethylether, polyvinylpyrrolidone, polyethylene glycol, polyvinyl acetal (including partially acetalized product), polyethyleneimine, polyethyleneoxide, styrene-maleic anhydride copolymer, polyvinylamine, polyallylamine, oxazoline group-containing water-soluble resin, water-soluble melamine resin, water-soluble urea resin, alkyd resin, and sulfonamide and salts produced by them. Besides, as the water-soluble polymer, polyglycerin may be used. These water-soluble polymers may be used singly or may be used in combination of two or more. The concentration of the water-soluble polymer in the aqueous solution is preferably less than 10% and more preferably less than 5%.

A surfactant may be added to the above aqueous solution. Concrete examples of the surfactant include sorbitan monooleate, glycerol α-monooleate, polyethylene glycol sorbitan fatty ester, polyethylene glycol straight-chain alkyl ether, polyethylene glycol phenyl ether straight-chain alkyl-addition, branched-chain alkyl-addition, acetylene glycol, anionic sodium laurate, sodium stearate, sodium oleate, sodium dodecyl sulfate, sodium dodecylbenzenesulfonic acid, and the like. These surfactants may be used singly or may be used in combination of two or more. The concentration of the surfactant in the aqueous solution is preferably less than 5%.

Further, the above aqueous solution is preferably acidic and, more specifically, the pH of the above aqueous solution is preferably 3 to 6.

The mixed liquid supply nozzle 38 supplies a mixed liquid made by mixing the surfactant solution and pure water. The mixed liquid is used as the rinse liquid. In other words, the mixed liquid supply nozzle 38 functions as a rinse liquid supply nozzle. Since the mixed liquid used as the rinse liquid is mixed with surfactant, the mixed liquid is larger than the water-based cleaning liquid in a contact angle with respect to the wafer. Concrete examples of the surfactant dissolved in the surfactant solution are the same as the above. Note that the mixed liquid made by mixing the surfactant solution and pure water is sometimes called a "surfactant-containing rinse liquid".

The gas supply nozzle 39 supplies gas. More specifically, the gas supply nozzle 39 supplies gas (for example, $N_2$ gas) to the wafer W in drying the rinse liquid on the wafer W.

To the developing solution supply nozzle 33, the DIW supply nozzle 36, the aqueous solution supply nozzle 37, and the mixed liquid supply nozzle 38, a liquid supply mechanism 100 is connected which supplies each of the nozzles with a corresponding liquid or solution. The liquid supply mechanism 100 includes, for each of the nozzles, a pump (not illustrated) which pressure-feeds each liquid or solution, a supply valve (not illustrated) which switches the supply of each liquid or solution and the stop of the supply, and so on.

Further, to the gas supply nozzle 39, a gas supply mechanism 110 is connected which supplies the nozzle with gas. The gas supply mechanism 110 has a supply valve (not illustrated) which switches the supply of gas and the stop of the supply.

In the above developing treatment apparatus 1, a controller 200 is provided as illustrated in FIG. 1. The controller 200 is a computer including, for example, a CPU, a memory, and so on, and has a program storage (not illustrated). In the program storage, programs for controlling various treatments in the developing treatment apparatus 1 are stored. Further, the program storage also stores programs for controlling the nozzle drives 34, 40, the liquid supply mechanism 100, the gas supply mechanism 110, and so on to realize a later-explained developing treatment. Note that the above programs may be the ones which are recorded on a computer-readable storage medium, and installed from the storage medium into the controller 200. Some or all of the programs may be realized by dedicated hardware (circuit board).

Figure 3:
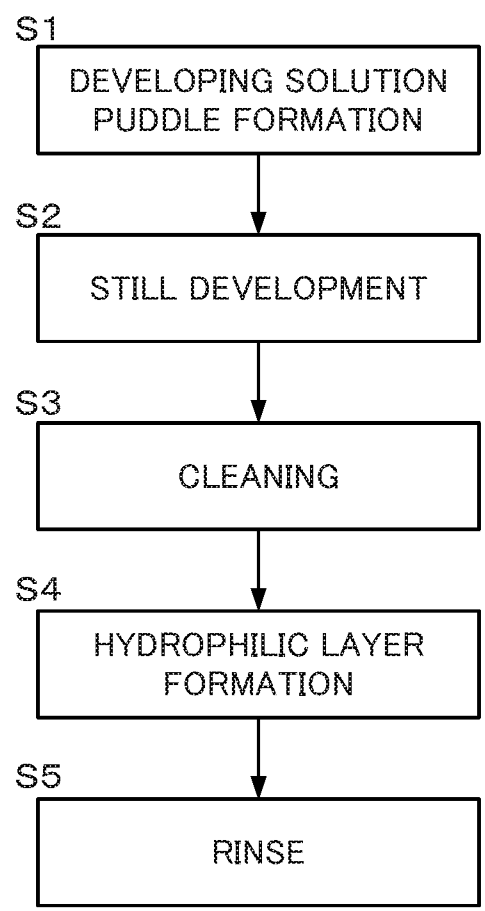
FIG. 3 is a flowchart illustrating an example of a developing treatment in the developing treatment apparatus in FIG. 1.
Figure 4:
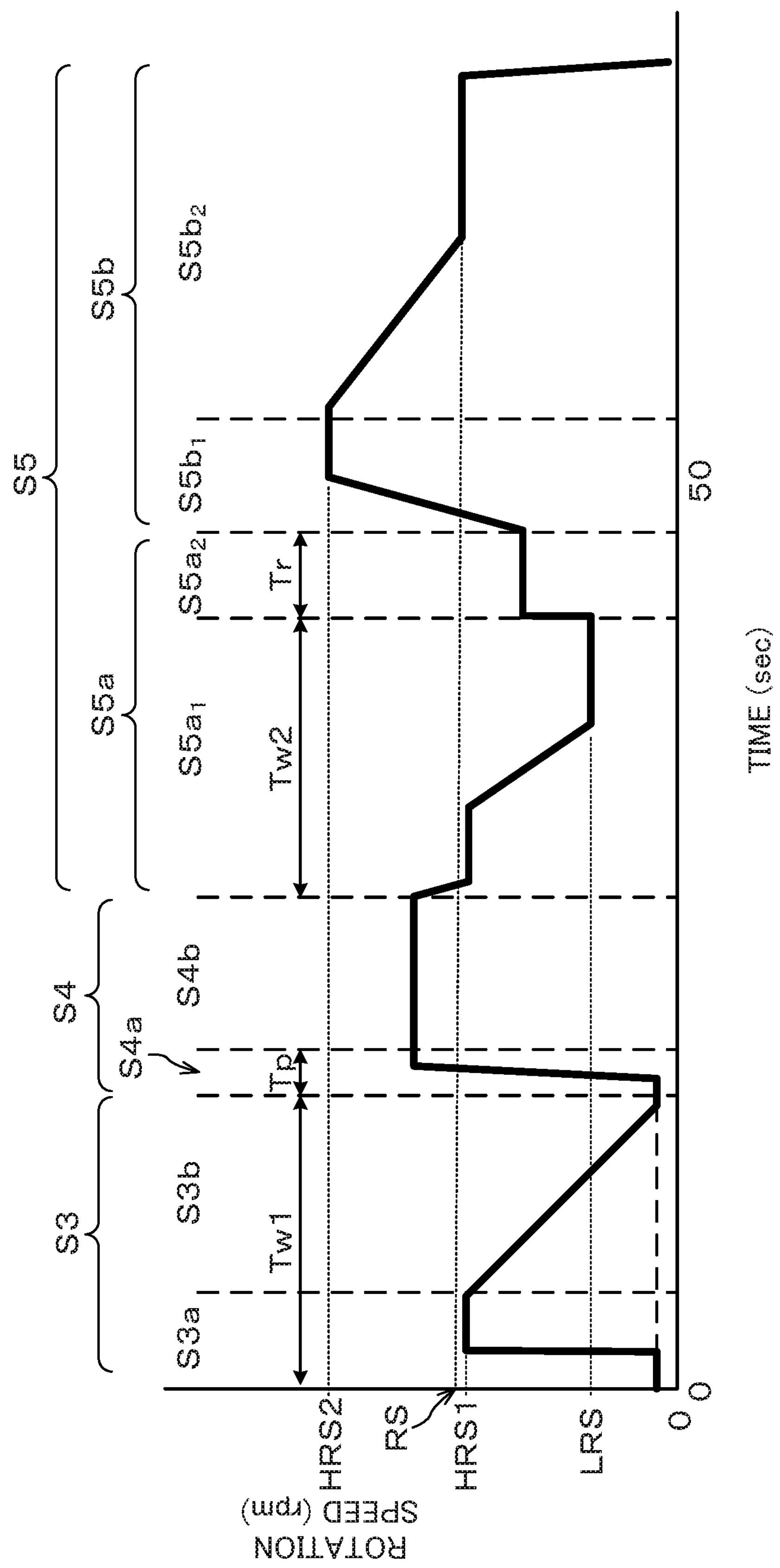
FIG. 4 is a chart illustrating a wafer rotation speed at each time point during the developing treatment in a cleaning process and thereafter.
Figure 5:
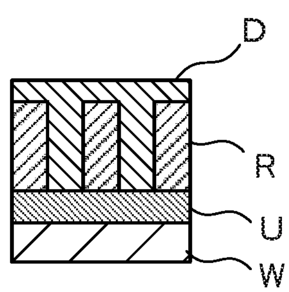
FIG. 5 is a partial enlarged sectional view illustrating the appearance of the wafer during the developing treatment.
Figure 5:
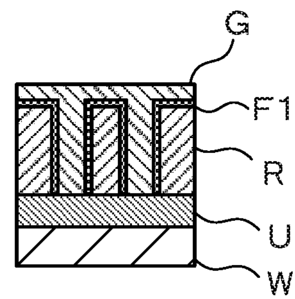
Figure 5:
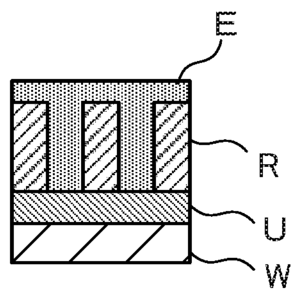
Figure 5:
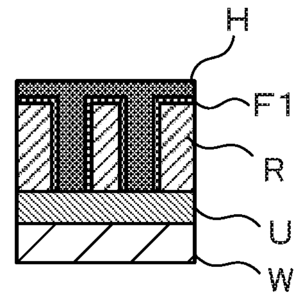
Figure 5:
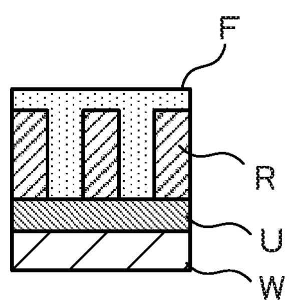
Figure 5:
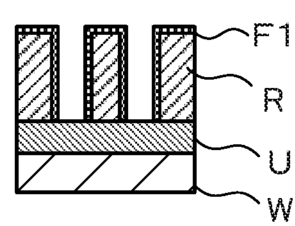
Figure 5:
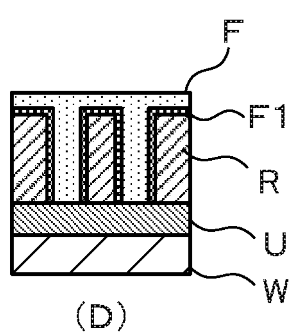
Figure 6:
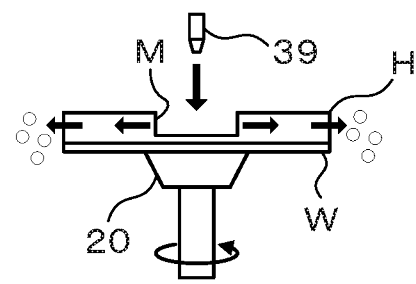
FIG. 6 is a sectional view illustrating the appearance of the wafer in a later-explained drying process of the developing treatment.
Figure 6:
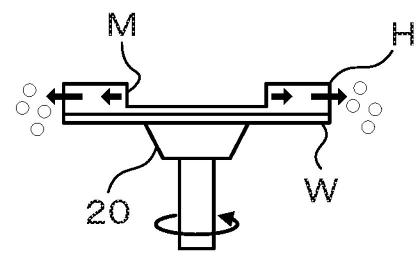

Here, an example of the developing treatment in the developing treatment apparatus 1 will be explained using FIG. 3 to FIG. 5. FIG. 3 is a flowchart illustrating an example of the developing treatment. FIG. 4 is a chart illustrating the rotation speed of the wafer W (hereinafter, called a "wafer rotation speed") at each time point during the developing treatment, and illustrates the wafer rotation speed in a later-explained cleaning process and thereafter. FIG. 5 is a partial enlarged sectional view illustrating the appearance of the wafer W during the developing treatment. FIG. 6 is a sectional view illustrating the appearance of the wafer W in a later-explained drying process of the developing treatment.

Note that, in the following explanation, it is assumed that a lower-layer film such as SiARC (Silicon-containing Anti-Reflective Coating) or the like has been formed on the surface of the wafer W to be transferred into the treatment container 10 and the resist film has been formed on the lower-layer film in advance. Further, it is assumed that the exposure processing on the resist film and the heat treatment thereafter have been completed and exposure for forming a line-and-space pattern has been performed in the above exposure processing. Note that the resist film formed on the lower-layer film of the wafer W has a large contact angle with respect to water. Besides, in the following processes, the flow rate of DIW is 350 ml/min, and the flow rates of the aqueous solution of the water-soluble polymer and the mixed liquid are 80 ml/min. Note that the flow rate of DIW only needs to be 250 to 450 ml/min, and the flow rates of the aqueous solution of the water-soluble polymer and the mixed liquid only need to be 50 to 100 ml/min and are preferably 75 to 90 ml/min.

(Step S1: Developing Solution Puddle Forming Process)

In the developing treatment, first, as illustrated in FIG. 3, a developing solution puddle is formed on the entire surface of the wafer W (Step S1). More specifically, the wafer W is transferred into the treatment container 10 and mounted and suction-held on the spin chuck 20. Then, the developing solution supply nozzle 33 is moved to above the wafer W, and the developing solution is discharged in a band shape from the developing solution supply nozzle 33, and the wafer W is caused to make, for example, one rotation, whereby a developing solution puddle is formed on the entire surface of the wafer W.

(Step S2: Still Developing Process)

After the formation of the developing solution puddle, the supply of the developing solution is stopped, and still development of making the wafer W stand still for a predetermined time is performed (Step S2). This process advances the development of the resist film on the wafer W, whereby a resist pattern R is formed on a lower-layer film U of the wafer W as illustrated in FIG. 5(A). Note that, during the still development, the developing solution supply nozzle 33 is retracted to the outside of the cup 22, and the DIW supply nozzle 36 is moved instead to above the central portion of the wafer W.

(Step S3: Cleaning Process)

After the still development, the wafer W is rotated, and DIW as the water-based cleaning liquid is supplied from the DIW supply nozzle 36 to the wafer W to clean the wafer W (Step S3). This process removes the developing solution and a dissolution product. Further, as illustrated in FIG. 5(A) and FIG. 5(B), a film D of the developing solution on the resist pattern R is replaced by DIW into a state where a film E of DIW is formed, and the state of being covered with liquid is maintained. The cleaning process at Step S3 includes the following accelerating process (Step S3*a*) and decelerating process (Step S3*b*) as illustrated in FIG. 4.

(Step S3*a*: Accelerating Process)

In the cleaning process, first, DIW is supplied to the rotating wafer W, and the wafer rotation speed is accelerated up to a predetermined rotation speed during the supply of DIW (Step S3*a*). More specifically, as illustrated in FIG. 4, immediately after the supply of DIW, the wafer rotation speed is maintained at a low rotation speed (for example, 50 to 200 rpm) and thereafter accelerated up to a predetermined high rotation speed HRS1 (for example, 700 rpm or more and 1800 rpm or less). This spreads DIW over the wafer W uniformly within the plane. Then, after the acceleration, the wafer rotation speed is maintained at the high rotation speed for a predetermined time. Thus, the developing solution and the dissolution product on the wafer W are efficiently drained. Note that the acceleration in the accelerating process is constant in this example.

(Step S3*b*: Decelerating Process)

After the accelerating process at Step S3*a*, the wafer rotation speed is decelerated until the start of a hydrophilic layer forming process at Step S4 subsequent to the cleaning process at Step S3 (Step S3*b*). In the accelerating process at Step S3*a* immediately before the decelerating process, the wafer rotation speed needs to be high in order to drain the developing solution and so on. In contrast to this, in the hydrophilic layer forming process at Step S4 immediately after the decelerating process, the wafer rotation speed immediately after the start of the hydrophilic layer forming process needs to be low in order to form a film of the aqueous solution of the water-soluble polymer uniformly within the plane as explained later. To this end, this decelerating process is provided, in which the wafer rotation speed is decelerated after the end of the accelerating process at Step S3*a*, down to a predetermined low rotation speed (for example, 50 to 200 rpm) at the start of the hydrophilic layer forming process at Step S4. Note that the deceleration at the decelerating process is constant in this example.

Further, the deceleration at the decelerating process at Step S3*b* is made to be lower than the acceleration in the accelerating process at Step S3*a*, and concretely set to 200 rpm/s or lower. This is for preventing a portion which is not covered with the film E of DIW from occurring at the peripheral portion of the wafer W.

At the end of the decelerating process, the supply of DIW from the DIW supply nozzle 36 is stopped, and then the aqueous solution supply nozzle 37 is moved to above the central portion of the wafer W.

(Step S4: Hydrophilic Layer Forming Process)

After the cleaning process, the aqueous solution of the water-soluble polymer (hereinafter, sometimes abbreviated as a "polymer aqueous solution") is applied to the rotating wafer W, and a layer having a hydrophilic property is formed on the surface of the wafer W including the surface of the resist pattern (Step S4). The hydrophilic layer forming process at Step S4 includes, as illustrated in FIG. 4, an aqueous solution supplying process (Step S4*a*) and a rotation maintaining process (Step S4*b*).

Further, the time from the stop of supply of DIW in the cleaning process at Step S3 to the start of supply of the polymer aqueous solution in the process at Step S4 is, for example, 0.7 seconds or less.

(Step S4*a*: Aqueous Solution Supplying Process)

In the hydrophilic layer forming process, first, the polymer aqueous solution is supplied from the aqueous solution supply nozzle 37 to the rotating wafer W, in other words, the wafer W is rotated while the polymer aqueous solution is being supplied to the wafer W (Step S4*a*). By this process, the film E of DIW on the resist pattern R is replaced by the polymer aqueous solution into a state where a film F of the polymer aqueous solution is formed as illustrated in FIG. 5(C).

In this process, immediately after the start of supply of the polymer aqueous solution, the wafer rotation speed is maintained at the low rotation speed (for example, 50 to 200 rpm), and then accelerated up to a predetermined high rotation speed (for example, 1000 rpm to 2000 rpm). Thus, the polymer aqueous solution is spread over the wafer W uniformly within the plane, whereby a film of the solution is formed uniformly within the plane. After the above acceleration, the supply of the polymer aqueous solution from the aqueous solution supply nozzle 37 is stopped.

Note that a supply time Tw1 of DIW in the cleaning process at Step S3 is longer than a supply time Tp of the polymer aqueous solution in the aqueous solution supplying process.

(Step S4*b*: Rotation Maintaining Process)

After the aqueous solution supplying process at Step S4*a*, the wafer is rotated for a predetermined time in a state where the polymer aqueous solution is not supplied (Step S4*b*). By this step, a hydrophilic layer F1 is formed on the surface of the wafer W including the surface of the resist pattern R as illustrated in FIG. 5(D).

In this process, the wafer rotation speed is maintained at the above high rotation speed (for example, 1000 rpm to 2000 rpm) in the aqueous solution supplying process at Step S4*a*. This can prevent the occurrence of a pullback in which the solution film at the wafer peripheral portion is pulled to the wafer central portion to expose the wafer peripheral portion.

The execution time of the rotation maintaining process is set to be longer than the execution time of the aqueous solution supplying process at Step S4*a*. Further, the execution time of the rotation maintaining process is, for example, 6 seconds or more.

Note that during the rotation maintaining process, the DIW supply nozzle 36 is moved to above the central portion of the wafer W.

(Step S5: Rinse Process)

After the hydrophilic layer forming process, the rinse liquid is supplied to the rotating wafer W to clean the wafer W (Step S5). The rinse process at Step S5 includes a rinse liquid supplying process (Step S5*a*) and a drying process (Step S5*b*) as illustrated in FIG. 4. The rinse liquid supplying process includes a first rinse liquid supplying process (Step S5$a_1$) and a second rinse liquid supplying process (Step S5$a_2$), and the drying process includes a first drying process (Step S5$b_1$) and a second drying process (Step S5$b_2$).

(Step S5*a*: Rinse Liquid Supplying Process)

The rinse liquid supplying process at Step S5*a* is a process of rotating the wafer W while supplying the rinse liquid to the wafer W on which the hydrophilic layer has been formed.

(Step S5$a_1$: First Rinse Liquid Supplying Process)

Then, in the first rinse liquid supplying process at Step S5$a_1$ being the first process of the rinse liquid supplying process, DIW as a first rinse liquid is supplied from the DIW supply nozzle 36 to the rotating wafer W (Step S5$a_1$). By this process, the polymer aqueous solution on the resist pattern R is replaced by DIW into a state where a film G of DIW is formed as illustrated in FIG. 5(E). In the first rinse liquid supplying process, the wafer rotation speed needs to be high for draining the polymer aqueous solution and so on. In contrast to this, in the second rinse liquid supplying process at Step S5$a_2$ immediately thereafter, the wafer rotation speed immediately after the start of the second rinse liquid supplying process (namely, immediately after the start of the supply of the surfactant-containing rinse liquid) needs to be low in order to form a film of the surfactant-containing rinse liquid uniformly within the plane. More specifically, the wafer rotation speed immediately after the start of the second rinse liquid supplying process needs to be set to a rotation speed (500 rpm or more and 1000 rpm or less) lower than the highest rotation speed in the first drying process. Therefore, in the first rinse liquid supplying process, the wafer rotation speed is maintained at a predetermined high rotation speed (for example, 1000 to 1500 rpm) for a predetermined time, and then decelerated. More specifically, the wafer rotation speed is decelerated by the end of the first rinse liquid supplying process, down to a predetermined low rotation speed LRS (500 rpm or more and 1000 rpm or less) at the start of the second rinse liquid supplying process, which is lower than a highest rotation speed HRS2 in the first drying process. After the deceleration, the supply of DIW from the DIW supply nozzle 36 is stopped, and the mixed liquid supply nozzle 38 is moved to above the central portion of the wafer W in place of the nozzle 36.

Note that, in the first rinse liquid supplying process, since the hydrophilic layer has been already formed on the surface of the resist pattern R, the deceleration of the wafer rotation speed can be made higher than that in the decelerating process at Step S3*b*, namely, the wafer rotation speed can be rapidly decreased. By making the deceleration of the wafer rotation speed in the second rinse liquid supplying process higher than that in the decelerating process at Step S3*b*, the time required for the first rinse liquid supplying process can be reduced.

(Step S5$a_2$: Second Rinse Liquid Supplying Process)

After the first rinse liquid supplying process, the surfactant-containing rinse liquid as the second rinse liquid is supplied from the mixed liquid supply nozzle 38 to the rotating wafer W (Step S5$a_2$). By this process, DIW on the resist pattern R is replaced by the surfactant-containing rinse liquid into a state where a film H of the rinse liquid is formed as illustrated in FIG. 5(F). In this process, the rotation speed of the wafer W is set to the low rotation speed LRS (for example, 500 rpm or more and 1000 rpm or less) immediately after the start of supply of the surfactant-containing rinse liquid, then accelerated up to a predetermined high rotation speed (for example, 1000 rpm), and maintained at the high rotation speed for a predetermined time. Thus, the surfactant-containing rinse liquid is spread over the wafer W uniformly within the plane to form a film of the rinse liquid uniformly within the plane. After the formation of the film, the supply from the mixed liquid supply nozzle 38 is stopped, and the gas supply nozzle 39 is moved to above the central portion of the wafer W in place of the nozzle 38.

Note that a supply time Tw2 of DIW in the first rinse liquid supplying process is longer than a supply time Tr of the surfactant-containing rinse liquid in the second rinse liquid supplying process.

(Step S5*b*: Drying Process)

The drying process at Step S5*b* is a process of rotating the wafer in a state where the rinse liquid is not supplied after the rinse liquid supplying process at Step S5*a*. By this process, the rinse liquid on the wafer W is dried to expose a resist pattern R as illustrated in FIG. 5(G).

(Step S5$b_1$: First Drying Process)

Then, in the first drying process at Step S5$b_1$ being the first process of the drying process, while gas is being supplied so as to form a recessed part M in the film of the rinse liquid at the central portion of the wafer W as illustrated in FIG. 6(A), the wafer rotation speed is accelerated to spread the recessed part M. The recessed part M is a start point of drying. In this process, the wafer rotation speed is accelerated up to, for example, a highest rotation speed HRS2 in this process, and then maintained at the highest rotation speed HRS2 for a predetermined time. The highest rotation speed is, for example, 700 rpm or more and 1800 rpm or less, and more preferably 800 rpm or more and 1500 rpm or less. Further, in this process, the wafer rotation speed may be accelerated at a constant acceleration or may be gradually accelerated, up to the highest rotation speed HRS2

Note that, at the end of the first drying process, the gas supply is stopped and the gas supply nozzle 39 is retracted to the outside of the cup 22. Further, the position of the gas supply nozzle 39 in this process is fixed to above the central portion of the wafer W.

(Step S5$b_2$: Second Drying Process)

After the first drying process, the wafer rotation speed is decelerated down to a predetermined rotation speed RS according to the spread of the recessed part M as illustrated in FIG. 6(B) (Step S5$b_2$). In this process, the wafer rotation speed is preferably decelerated down to a predetermined rotation speed of, for example, 600 rpm or more. The predetermined rotation speed is preferably 1500 rpm or less. After the deceleration, the wafer rotation speed is maintained at the rotation speed RS for a predetermined time, and then the rotation of the wafer W is stopped.

Note that the deceleration of the wafer rotation speed in the second drying process may be performed at a constant deceleration or may be gradually performed.

After the rinse process at Step S5, the wafer W is transferred out of the treatment container 10, and the developing treatment is finished.

As explained above, the developing treatment method according to this embodiment includes the process of supplying the developing solution to the wafer W to develop the resist film to thereby form the resist pattern, the process of supplying DIW to the developed wafer to clean the wafer W with DIW, the process of applying the polymer aqueous solution to the wafer W cleaned with the DIW to form the hydrophilic layer on the surface of the wafer W, and the process of cleaning the wafer W on which the hydrophilic layer has been formed, with the rinse liquid. According to the developing treatment method, even in the case where the resist film having a large contact angle with respect to water is formed on the wafer W, the hydrophilic layer is formed on the wafer W to decrease the contact angle of the wafer W with respect to water. Therefore, a liquid break of the rinse liquid in drying by rotating the wafer becomes less likely to occur, in other words, the rinse liquid becomes less likely to remain on the wafer W. Accordingly, the pattern collapse due to the rinse liquid remaining on the wafer W and the defects caused from the dissolution product contained in the remaining rinse liquid are unlikely to occur.

Here, it is assumed that the decelerating process at Step S3*b* is not performed and the wafer rotation speed at the start of the hydrophilic layer forming process at Step S4 is maintained at the high rotation speed, unlike this embodiment. In this case, the polymer aqueous solution is difficult to spread to the entire region within the wafer in the hydrophilic layer forming process at Step S4 because the pattern surface has a high contact angle or the like, resulting in unevenness in the formation state of the hydrophilic layer formed of the polymer aqueous solution. In contrast to this, in this embodiment, the decelerating process at Step S3*b* is performed to decelerate the rotation speed of the wafer W from the high rotation speed, at the start of the hydrophilic layer forming process at Step S4. Therefore, the polymer aqueous solution can be temporarily accumulated at the central portion of the wafer W, and the polymer aqueous solution can be spread over the entire surface of the wafer W by increasing the rotation speed thereafter. Accordingly, the formation state of the hydrophilic layer can be made uniform within the wafer.

Besides, it is assumed that the deceleration in the decelerating process at Step S3*b* is made equal to the acceleration in the accelerating process at Step S3*a*, unlike this embodiment. In this case, DIW covering also the wafer peripheral portion comes closer to the wafer center side due to the rapid deceleration and the surface tension of DIW, thus generating a portion which is not covered with DIW at the wafer peripheral portion. Thus, when the polymer aqueous solution is applied in the hydrophilic layer forming process at Step S4 subsequent to DIW, the aqueous solution does not sufficiently spread down to the wafer peripheral portion, resulting in unevenness in the formation state of the hydrophilic layer. In contrast to this, in this embodiment, the deceleration in the decelerating process at Step S3*b* is made lower than the acceleration in the accelerating process at Step S3*a*, so that when the polymer aqueous solution is applied subsequent to DIW, the formation state of the hydrophilic layer can be made uniform within the wafer since the entire wafer W is covered with DIW.

In other words, according to this embodiment, the state where the top of wafer W is uniformly covered with DIW is created and the application of the polymer aqueous solution is started to the wafer W rotated at a low rotation speed, so that the hydrophilic layer can be formed more uniformly within the wafer to prevent the liquid break at the rinse time. As a result of this, the defects can be reduced in number.

Further, in view of the property of covering with DIW, it is assumed that the deceleration in the decelerating process at Step S3*b* is made low, and the acceleration in the accelerating process at Step S3*a* is made to be equal to or less than the deceleration, unlike this embodiment. In this case, the treatment efficiency (the efficiency of draining the dissolution product and the efficiency of replacing the film of the developing solution by the film of DIW) in the cleaning process at Step S3 decreases, resulting in increased time required for the cleaning process. In this embodiment, the acceleration in the accelerating process at Step S3*a* is higher than the deceleration in the decelerating process at Step S3*b*, thus making it possible to achieve both the maintenance of the property of covering with DIW and the prevention of the increase in time of the cleaning process at Step S3.

Further, in this embodiment, the drying process at Step S5*b* includes the first drying process in which while gas is being supplied so as to form the recessed part M in the film of the rinse liquid at the central portion of the wafer W, the wafer rotation speed is accelerated to spread the recessed part. Further, the drying process at Step S5*b* includes the second drying process in which while the supply of the gas is being maintained, the wafer rotation speed is decelerated according to the spread of the recessed part. By the formation of the recessed part at the central portion of the wafer W, the quantity of the rinse liquid at the central portion of the wafer W where the centrifugal force is small is decreased. Further, in subsequently draining the rinse liquid by rotation to dry the wafer W, the recessed part becomes the start point of drying and easily receives the centrifugal force to easily drain the liquid, thereby making it possible to reduce the risk of occurrence of remaining liquid.

Figure 7:
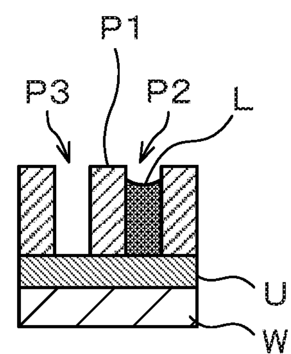
FIG. 7 is a view for explaining the effect according to the first embodiment.

Further, in the case of a line-and-space pattern, the formation of the recessed part can prevent a large difference in how the rinse liquid remains from occurring between the spaces with the line pattern intervening therebetween. The state where the “large difference” occurs is, for example, a state where a large quantity of a rinse liquid L remains in a space P2 next to one side surface of a certain line pattern P1 of the line-and-space pattern, and no rinse liquid remains in a space P3 next to another side surface thereof as illustrated in FIG. 7. If the above “large difference in how the rinse liquid remains between the spaces with the line pattern intervening therebetween” occurs, a large difference in surface tension acting on the line pattern occurs between the one side surface and the other side surface of the line pattern, causing a pattern collapse. According to this embodiment, it is possible to prevent the occurrence of the large difference in how the rinse liquid remains as above, thus making it possible to prevent the occurrence of the large difference in surface tension and prevent the occurrence of the pattern collapse.

Further, in this embodiment, after the recessed part is spread outward to some extent, the rotation speed is decelerated so as to prevent the centrifugal force from excessively acting on the pattern near the interface between the recessed part and the outside thereof, so that the pattern collapse is unlikely to occur.

Note that after the gas is supplied to form the recessed part, the wafer W may be rotated to spread the recessed part in a state where the supply of the gas is stopped.

Note that the flow rates of the gas in the first drying process and the second drying process are preferably not so high that the surfactant-containing rinse liquid at a portion to which the gas is sprayed is blown off to expose the resist pattern. This is because if the flow rates are so high that the resist pattern is exposed, the large difference in how the rinse liquid remains occurs to make the pattern collapse more likely to occur near the interface of the recessed part, and there is a risk that the pattern collapse occurs due to the pressure of the gas itself.

Further, in this embodiment, the highest rotation speed HRS2 of the wafer W in the first drying process is 700 rpm or more and 1800 rpm or less.

The present inventors repeatedly performed the developing treatment while changing the condition of the highest rotation speed HRS2 of the wafer W in the first drying process. In the performed developing treatment, the other conditions were set to conditions in the ranges in the above explanation relating to this embodiment. According to the result of the research by the inventors, many defects occurred over the entire wafer at a highest rotation speed of less than 700 rpm, and few defects occurred at the wafer central portion but many defects occurred at the wafer peripheral portion at a highest rotation speed of exceeding 1800 rpm. In contrast to this, at a highest rotation speed of 700 rpm or more and 1800 rpm or less, few defects occurred at least at the central portion of the wafer W where the recessed part was formed in the film of the rinse liquid by the gas supply. A conceivable reason why many defects occurred over the entire wafer at the highest rotation speed of less than 700 rpm is that the wafer rotation speed was low and therefore the centrifugal force acting on the rinse liquid on the wafer W was small to make a large quantity of the rinse liquid remain on the wafer. Besides, a conceivable reason why many defects occurred at the wafer peripheral portion when the highest rotation speed of exceeding 1800 rpm is that a liquid break of the rinse liquid occurred at the wafer peripheral portion to make the rinse liquid remain on the wafer peripheral portion.

Further, in this embodiment, in the second drying process, the wafer rotation speed is decelerated from the highest rotation speed in the first drying process down to the predetermined speed (hereinafter, a finally reached wafer rotation speed) of 600 rpm or more.

For the research of the range of the finally reached wafer rotation speed in the second drying process, the present inventors repeatedly performed the developing treatment while varying the finally reached wafer rotation speed. In the performed developing treatment, the highest rotation speed in the first drying process was set to 1800 rpm and the other conditions were set to conditions in the ranges in the above explanation relating to this embodiment. According to the result of the research by the inventors, many defects occurred over the entire wafer at the finally reached wafer rotation speed in the second drying process of less than 600 rpm, and few defects occurred at 600 rpm or more. A conceivable reason why many defects occurred over the entire wafer at the finally reached wafer rotation speed of less than 600 rpm is that the interface of the recessed part formed in the film of the rinse liquid spread outward in the second drying process, but if the wafer rotation speed is low, the centrifugal force acting on the rinse liquid is small to make a large quantity of the rinse liquid remain on the wafer.

Note that in the second drying process, the reason why the wafer rotation speed is decelerated from the highest rotation speed in the first drying process is that if the wafer rotation speed is not decelerated, a liquid break of the rinse liquid may occur at the wafer peripheral portion to make the rinse liquid remain on the wafer peripheral portion, causing defects. Note that the finally reached wafer rotation speed in the second drying process is preferably 1500 rpm or less. This is because according to the result of the research by the inventors, many defects occurred at the wafer outer peripheral portion when the finally reached wafer rotation speed exceeded 1500 rpm.

Furthermore, the developing treatment method according to this embodiment includes the first rinse liquid supplying process of rotating the wafer W while supplying DIW to the wafer W on which the hydrophilic layer has been formed, and the second rinse liquid supplying process of then rotating the wafer W while supplying the surfactant-containing rinse liquid. Then, in the first rinse liquid supplying process, the wafer W is rotated at the predetermined rotation speed, and then the rotation speed of the wafer W is decelerated by the end of the first rinse liquid supplying process down to the predetermined low rotation speed at the start of the second rinse liquid supplying process, which is lower than the highest rotation speed in the first drying process. This can perform switching to the supply of the surfactant-containing rinse liquid low in surface tension while maintaining the state of covering with DIW.

The predetermined low rotation speed at the start of the second rinse liquid supplying process is, for example, 500 rpm or more and 1000 rpm or less.

For the research of the range of the predetermined low rotation speed at the start of the second rinse liquid supplying process, the present inventors repeatedly performed the developing treatment while changing the low rotation speed. In the performed developing treatment, the other conditions were set to conditions in the ranges in the above explanation relating to this embodiment. However, the wafer rotation speed was not accelerated but made constant during the second rinse liquid supplying process. According to the result of the research by the inventors, when the rotation speed during the second rinse liquid supplying process was 500 to 1000 rpm, there were few defects. In the case where the rotation speed was less than 500 rpm, many defects occurred. This is conceivably because the surfactant-containing rinse liquid did not spread within the entire wafer because of the low wafer rotation speed. Besides, when the rotation speed exceeded 1000 rpm, many defects occurred. This is conceivably because a liquid break of the rinse liquid occurred at the wafer peripheral portion because of the high wafer rotation speed, and the rinse liquid remained on the wafer peripheral portion.

Note that the wafer rotation speed during the second rinse liquid supplying process is more preferably 1000 rpm or less at all times. This is because, according to the result of the research by the inventors, when the wafer rotation speed was too high at the time when the second rinse liquid spread over the wafer W, a coverage failure due to the liquid break was found, whereas when the wafer rotation speed was 1000 rpm or less, there was no coverage failure and the treatment was able to be performed without any problem.

Further, in this embodiment, the hydrophilic layer forming process at Step S4 includes the aqueous solution supplying process of rotating the wafer W while supplying the polymer aqueous solution to the wafer W cleaned with DIW, and the rotation maintaining process of then rotating the wafer W in a state of not supplying the polymer aqueous solution.

If the polymer aqueous solution is supplied for a long time in forming the hydrophilic layer, the absolute quantity of the water-soluble polymer becomes large to cause a risk that the water-soluble polymer remains as a residue. However, if the supply of the water-soluble polymer is stopped and the rotation of the wafer W is also stopped, a pullback occurs to impair the in-plane uniformity of the covering with the polymer aqueous solution. In contrast to this, in this embodiment, the rotation of the wafer W is continued even after the supply of the polymer aqueous solution is stopped, so that the risk of the residue can be reduced. Further, the occurrence of a pullback can be prevented and the hydrophilic layer can be formed uniformly within the wafer.

Further, the surfactant-containing rinse liquid is often adjusted to be acidic for improvement of the cleaning property and, in accordance therewith, the polymer aqueous solution is also adjusted to be acidic in some cases. In this case, if the polymer aqueous solution is continuously supplied, pattern thinning may proceed. By stopping the supply of the polymer aqueous solution as in this embodiment, the pattern thinning can also be prevented.

Further, in this embodiment, the supply time Tw1 of DIW in the cleaning process at Step S3 is longer than the supply time Tp of the polymer aqueous solution in the aqueous solution supplying process at Step S4*a*. Though DIW in the cleaning process at Step S3 is used for draining the developing solution and the dissolution product, a method of performing the draining by the polymer aqueous solution is conceivable. In this case, however, the supply of the polymer aqueous solution becomes excessive, and the risk of the residue and the pattern thinning in the case where the polymer aqueous solution is acidic as in the above may occur. In contrast to this, in this embodiment, the supply time Tw1 of DIW is made long and the draining is performed by DIW, so that the supply time Tp of the polymer aqueous solution does not need to be made long and the above risk of the residue is never increased. Further, by increasing the supply time of DIW, the liquid film of DIW low in reactivity with the other liquids or solutions can cover the entire wafer W for the next process.

Note that in this embodiment, the supply time Tw2 of DIW in the first rinse liquid supplying process is longer than the supply time Tr of the surfactant-containing rinse liquid in the second rinse liquid supplying process. If the supply time Tr of the surfactant-containing rinse liquid is long, the supply of the rinse liquid becomes excessive, the pattern thinning may occur when the rinse liquid is acidic. According to this embodiment, the pattern thinning can be prevented.

Further, in this embodiment, the time from the stop of supply of DIW in the cleaning process at Step S3 to the start of supply of the polymer aqueous solution in the hydrophilic layer forming process at Step S4 (hereinafter, called a "switch time to the aqueous solution" in some cases) is, for example, 0.7 seconds or less.

Further, it is preferable that the time from the stop of supply of DIW in the first rinse liquid supplying process to the start of supply of the surfactant-containing rinse liquid in the second rinse liquid supplying process (hereinafter, a "rinse liquid switch time") is also set to 0.7 seconds or less.

For the research of the range of the rinse liquid switch time, the present inventors repeatedly performed the developing treatment while varying the rinse liquid switch time. In the performed developing treatment, the other conditions were set to conditions in the ranges in the above explanation relating to this embodiment. According to the result of the research by the inventors, there were few defects when the rinse liquid switch time was 0.7 seconds or less. In the case where the rinse liquid switch time exceeded 0.7 seconds, many defects occurred at the wafer peripheral portion. This is conceivably because the rinse liquid switch time was long and therefore DIW at the wafer peripheral portion dried, resulting in that the surfactant-containing rinse liquid did not spread down to the wafer peripheral portion.

The result of the research of the rinse liquid switch time is applicable also to the switch time to the aqueous solution. This is because DIW is used as the liquid used before the switch, in common for the case of the switch of the rinse liquid and the case of the switch to the aqueous solution, and the rotation speed of the wafer W after the switch is almost the same in both the cases.

Further, in this embodiment, the highest rotation speed of the wafer W in the accelerating process at Step S3*a* in the cleaning process at Step S3 is 700 rpm or more and 1800 rpm or less.

For the research of the range of the highest rotation speed of the wafer W in the accelerating process at Step S3*a*, the present inventors repeatedly performed the developing treatment while varying the highest rotation speed. In the performed developing treatment, the other conditions were set to conditions in the ranges in the above explanation relating to this embodiment. According to the result of the research by the inventors, there were few defects when the highest rotation speed in the accelerating process was 700 rpm or more and 1800 rpm or less. When the highest rotation speed was less than 700 rpm, many defects occurred. This is conceivably because the wafer rotation speed was low and therefore the centrifugal force acting on DIW or the like was small, resulting in that the dissolution product was not discharged. Further, when the highest rotation speed exceeded 1800 rpm, many defects occurred. This is conceivably because the wafer rotation speed was high and therefore the portion not covered with DIW occurred at the wafer peripheral portion, resulting in that the hydrophilic layer was not formed uniformly within the plane.

Second Embodiment

Figure 8:
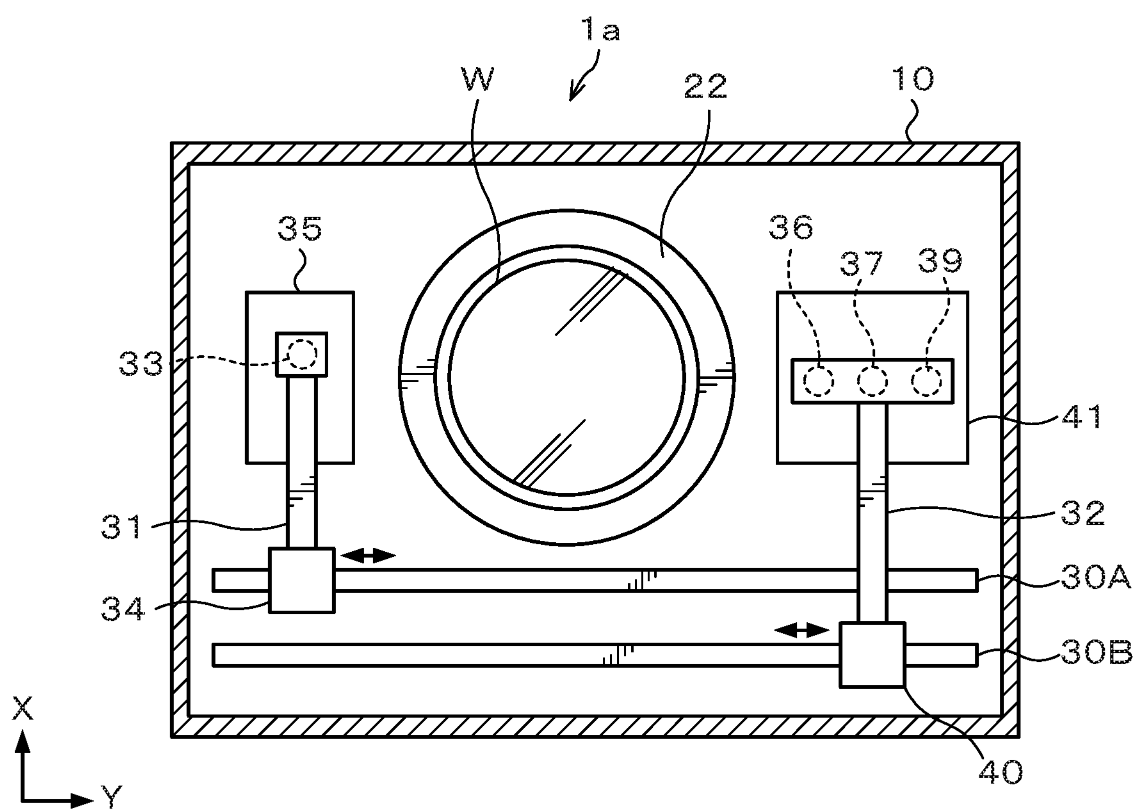
FIG. 8 is a transverse sectional view illustrating the outline of a configuration of a developing treatment apparatus according to a second embodiment.

FIG. 8 is a transverse sectional view illustrating the outline of a configuration of a developing treatment apparatus 1*a* according to a second embodiment.

The developing treatment apparatus 1*a* in FIG. 8 is made by omitting the mixed liquid supply nozzle 38 in the developing treatment apparatus 1 according to the first embodiment in FIG. 2 and so on. In the developing treatment apparatus 1 according to the first embodiment, two types such as DIW and the surfactant-containing rinse liquid are used as the rinse liquid, whereas only one type such as DIW is used as the rinse liquid in the developing treatment apparatus 1*a*.

Figure 9:
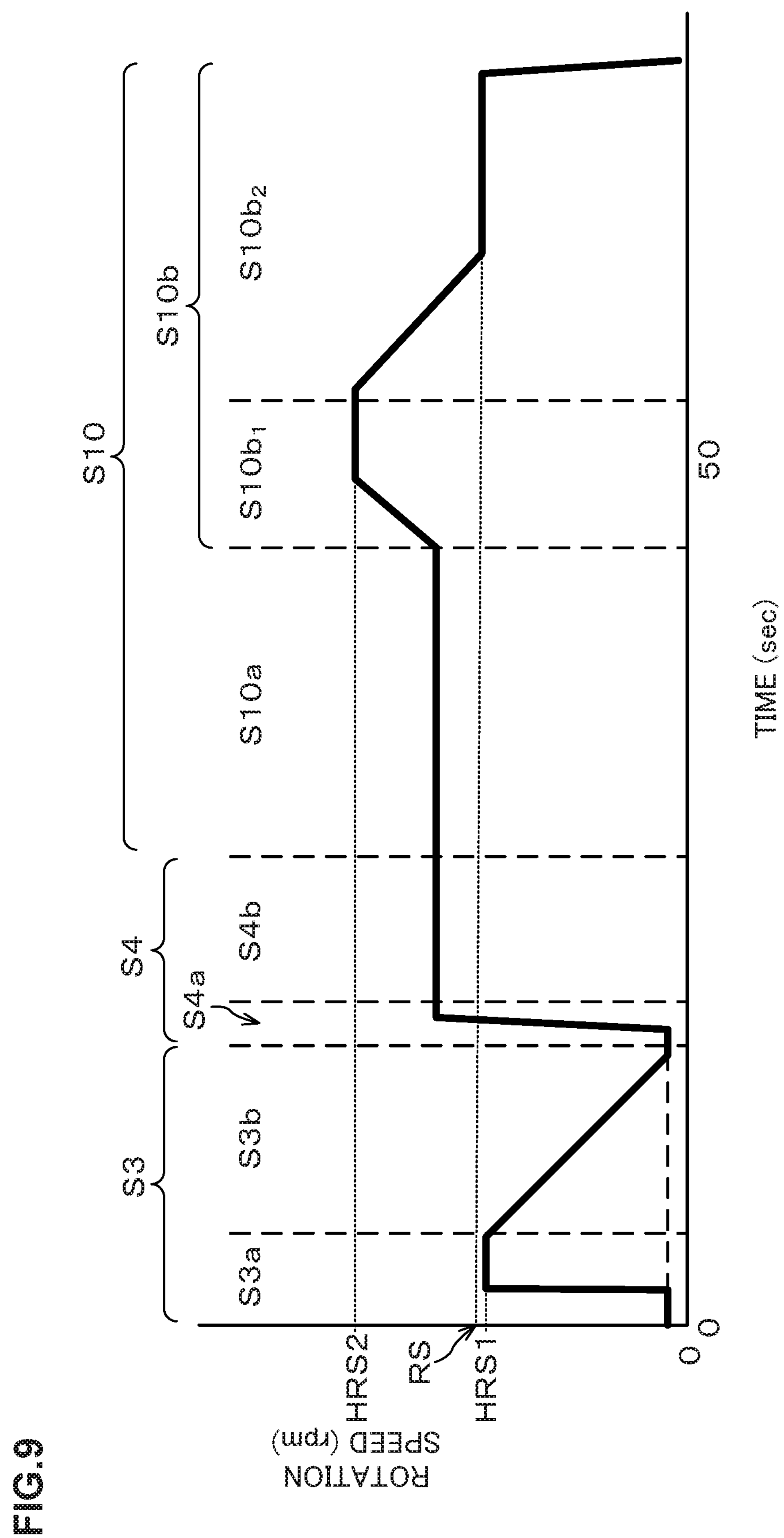
FIG. 9 is a chart illustrating a wafer rotation speed at each time point in the cleaning process and thereafter during the developing treatment in the developing treatment apparatus in FIG. 8.

Subsequently, one example of the developing treatment in the developing treatment apparatus 1*a* will be explained using FIG. 9. FIG. 9 is a chart illustrating the wafer rotation speed at each time point during the developing treatment in the cleaning process and thereafter.

Note that only a part of the developing treatment in the developing treatment apparatus 1*a* different from that of the developing treatment in the developing treatment apparatus 1 in FIG. 2 and so on will be explained hereinafter and, concretely, only the rinse process will be explained.

In the developing treatment in the developing treatment apparatus 1*a*, after the above developing solution puddle forming process at Step S1, the still developing process at Step S2, the cleaning process at Step S3, and the hydrophilic layer forming process at Step 4 are performed in sequence, the following rinse process (Step S10) is performed.

(Step S10: Rinse Process)

In the rinse process at Step S10, the rinse liquid is supplied to the rotating wafer W after the hydrophilic layer forming process at Step S4, to clean the wafer W. The rinse process includes a rinse liquid supplying process (Step S10*a*) and a drying process (Step S10*b*) as illustrated in FIG. 9. The drying process includes a first drying process (Step S10$b_1$) and a second drying process (Step S10$b_2$).

(Step S10*a*: Rinse Liquid Supplying Process)

The rinse liquid supplying process at Step S10*a* is a process of rotating the wafer W while supplying a rinse liquid to the wafer W on which the hydrophilic layer has been formed. More specifically, DIW as the rinse liquid is supplied from the DIW supply nozzle 36 to the rotating wafer W. In this process, the wafer rotation speed is maintained at, for example, the same rotation speed (for example, 1000 rpm to 2000 rpm) as that in the rotation maintaining process at Step S4*b*. After a lapse of a predetermined time from the start of supply of the rinse liquid, the supply of the rinse liquid from the DIW supply nozzle 36 is stopped, and the gas supply nozzle 39 is moved to above the central portion of the wafer W in place of the nozzle 36.

(Step S10*b*: Drying Process)

The drying process at Step S10*b* is a process of rotating the wafer in a state of not supplying the rinse liquid after the rinse liquid supplying process at Step S10*a*. By this process, the rinse liquid on the wafer W is dried.

(Step S10$b_1$: First Drying Process)

Then, in the first drying process at Step S10$b_1$ being the first process of the drying process, while gas is being supplied so as to form a recessed part in the film of DIW at the central portion of the wafer W, the wafer rotation speed is accelerated to spread the recessed part as in the first drying process at above Step S5$b_1$ (Step S10$b_1$). In this process, the wafer rotation speed is accelerated, for example, from the wafer rotation speed (for example, 1000 rpm to 2000 rpm) in the rinse liquid supplying process up to a highest rotation speed HRS2 (for example, 1500 rpm or more) in this process, and then maintained at the highest rotation speed HRS2 for a predetermined time. Note that the wafer rotation speed may be accelerated at a constant acceleration or may be gradually accelerated, up to the highest rotation speed HRS2 in this process.

Note that, at the end of the first drying process, the gas supply is stopped and the gas supply nozzle 39 is retracted to the outside of the cup 22. Further, the position of the gas supply nozzle 39 in this process is fixed to above the central portion of the wafer W.

(Step S10$b_2$: Second Drying Process)

After the first drying process, the wafer rotation speed is decelerated down to a predetermined rotation speed RS according to the spread of the recessed part formed in the film of DIW on the wafer W as in the second drying process at above Step S5$b_2$ (Step S10$b_2$). In this process, the wafer rotation speed is preferably decelerated down to, for example, 800 rpm or more and 1800 rpm or less, and more preferably decelerated down to, for example, 800 rpm or more and 1500 rpm or less. After the deceleration, the wafer rotation speed is maintained at the rotation speed RS for a predetermined time, and then the rotation of the wafer W is stopped.

Note that the deceleration of the wafer rotation speed in the second process may be performed at a constant deceleration or may be gradually performed.

In this embodiment, the supply of the surfactant-containing rinse liquid is not performed, but also in the case where the resist film having a large contact angle with respect to water is formed on the wafer W, the hydrophilic layer is formed on the wafer W to decrease the contact angle of the wafer W with respect to water as in the first embodiment. Therefore, a liquid break of the rinse liquid in drying by rotating the wafer W becomes less likely to occur to make the defects unlikely to occur also in this embodiment.

Further, also in this embodiment, the decelerating process at Step S3*b* is also performed, and the deceleration in this process is made lower than the acceleration in the accelerating process at Step S3*a*, so that the hydrophilic layer can be formed more uniformly within the wafer to prevent the liquid break at the rinse time. As a result of this, the defects can be reduced in number.

Further, in this embodiment, the drying process at Step S10 similar to the drying process at Step S5*b* is performed. This can reduce the risk of occurrence of a large-quantity rinse liquid remaining portion. Further, in the case where the resist pattern is the line-and-space pattern, the occurrence of the pattern collapse can be prevented. Furthermore, in this embodiment, after the recessed part is spread outward to some extent, the rotation speed is decelerated so as to prevent the force acting on the pattern near the interface between the recessed part and the outside thereof from becoming excessive, so that the pattern collapse is unlikely to occur.

In the above explanation, the resist pattern is the line-and-space pattern. However, the above embodiments are applicable to other resist patterns such as a hole pattern.

Besides, a still development method of forming the puddle of the developing solution and then stopping the supply of the developing solution and the rotation of the wafer W is employed as the method of development in the above. The technique according to this disclosure is also applicable to a rotation development method (also called a puddleless development) which continuously supplies the developing solution while rotating the wafer W.

Note that in the above explanation, DIW is used as the water-based cleaning liquid and the first rinse liquid, namely, the water-based rinse liquid. However, pure water or pure water with a little quantity of other substances added may be used as the water-based cleaning liquid and the water-based rinse liquid, which only needs to be the one containing water as a main component (for example, a water content of 50 mass % or more).

The embodiments disclosed herein are only examples in all respects and should not be considered to be restrictive. The above embodiments may be abbreviated, replaced, or changed in various forms without departing from the scope and spirit of the attached claims.

Note that the following configurations also belong to the technical scope of this disclosure.

(1) A developing treatment method for performing a developing treatment on a resist film on a substrate, the developing treatment method including:

- (A) supplying a developing solution to the substrate and developing the resist film to form a resist pattern;
- (B) supplying a water-based cleaning liquid to the developed substrate to clean the substrate with the water-based cleaning liquid;
- (C) applying an aqueous solution of a water-soluble polymer to the substrate cleaned with the water-based cleaning liquid to form a hydrophilic layer having a hydrophilic property on a surface of the substrate; and
- (D) cleaning the substrate on which the hydrophilic layer has been formed, with a rinse liquid, the (B) including:

- (a) accelerating a rotation speed of the substrate; and
- (b) after the (a), decelerating the rotation speed of the substrate until a start of the (C), wherein
- a deceleration in the (b) is lower than an acceleration in the (a).

According to the (1), even in the case where the resist film having a large contact angle with respect to water is formed on the substrate, a liquid break of the rinse liquid in draining the rinse liquid by rotation to dry the substrate becomes less likely to occur, in other words, the rinse liquid becomes less likely to remain on the substrate. Accordingly, the defects caused from the rinse liquid remaining on the substrate are unlikely to occur.

Further, the hydrophilic layer can be formed more uniformly within the substrate to prevent the liquid break at the rinse time. As a result of this, the defects can be reduced in number.

(2) The developing treatment method according to the (1), wherein the (D) includes:

- (c) rotating the substrate while supplying the rinse liquid to the substrate on which the hydrophilic layer has been formed; and
- (d) after the (c), rotating the substrate in a state of not supplying the rinse liquid, to dry the substrate, the (d) including:

- (m) accelerating the rotation speed of the substrate while supplying gas so as to form a recessed part in a film of the rinse liquid at a center on the substrate to spread the recessed part; and
- (n) after the (m), decelerating the rotation speed of the substrate according to a spread of the recessed part.

According to the (2), the risk of occurrence of a large-quantity rinse liquid remaining portion can be reduced. Further, in the case where the resist pattern is the line-and-space pattern, the occurrence of the pattern collapse can be prevented. Furthermore, according to the (2), after the recessed part is spread outward to some extent, the rotation speed is decelerated so as to prevent the force acting on the pattern near the interface between the recessed part and the outside thereof from becoming excessive, so that the pattern collapse is unlikely to occur.

(3) The developing treatment method according to the (2), wherein:

- a highest rotation speed of the substrate in the (m) is 700 rpm or more and 1800 rpm or less; and
- the (n) decelerates the rotation speed of the substrate from the highest rotation speed of the substrate in the (m) down to a predetermined rotation speed of 600 rpm or more.

(4) The developing treatment method according to the (2) or (3), wherein:

the (c) at the (D) includes:

(x) rotating the substrate while supplying a water-based rinse liquid to the substrate on which the hydrophilic layer has been formed; and (y) after the (x), rotating the substrate while supplying a surfactant-containing rinse liquid to the substrate; and in the (x), the substrate is rotated at a predetermined rotation speed, and then the rotation speed of the substrate is decelerated by an end of the (x), down to a rotation speed at a start of the (y) which is lower than a highest rotation speed in the (m).

According to the (4), it is possible to perform switching to the supply of the surfactant-containing rinse liquid low in surface tension while maintaining the state of covering with a water-based rinse liquid.

(5) The developing treatment method according to any one of the (1) to (4), wherein the (C) includes:

(e) rotating the substrate while supplying the aqueous solution of the water-soluble polymer to the substrate cleaned with the water-based cleaning liquid; and (f) after the (e), rotating the substrate in a state of not supplying the aqueous solution of the water-soluble polymer.

According to the (5), it is possible to reduce the risk that the water-soluble polymer remains as a residue. Further, it is possible to prevent the occurrence of a pullback and to form the hydrophilic layer uniformly within the substrate. Furthermore, it is possible to prevent the pattern thinning in the case where the aqueous solution of the water-soluble polymer is adjusted to be acidic.

(6) The developing treatment method according to any one of the (1) to (5), wherein a supply time of the water-based cleaning liquid at the (B) is longer than a supply time of the aqueous solution of the water-soluble polymer at the (C).

According to the (6), the risk that the water-soluble polymer remains as a residue and the risk that the pattern thinning occurs in the case where the aqueous solution of the water-soluble polymer is acidic never increase. Further, by increasing the supply time of the water-based cleaning liquid, the solution film of the water-based cleaning liquid low in reactivity with the other solutions can cover the entire substrate for the next process.

(7) The developing treatment method according to any one of the (1) to (6), wherein a time from a stop of the supply of the water-based cleaning liquid at the (B) to a start of the supply of the aqueous solution of the water-soluble polymer at the (C) is 0.7 seconds or less.

(8) The developing treatment method according to any one of the (1) to (7), wherein a highest rotation speed of the substrate in the (a) at the (B) is 700 rpm or more and 1800 rpm or less.

(9) A developing treatment apparatus for performing a developing treatment on a resist film on a substrate, the developing treatment apparatus including:

a substrate holder configured to hold the substrate;

a rotation mechanism configured to rotate the substrate holder;

a developing solution supply nozzle configured to supply a developing solution to the substrate held by the substrate holder;

a water-based cleaning liquid supply nozzle configured to supply a water-based cleaning liquid to the substrate held by the substrate holder;

an aqueous solution supply nozzle configured to supply an aqueous solution of a water-soluble polymer to the substrate held by the substrate holder;

a rinse liquid supply nozzle configured to supply a rinse liquid to the substrate held by the substrate holder;

a moving mechanism configured to move the developing solution supply nozzle, the water-based cleaning liquid supply nozzle, the aqueous solution supply nozzle, and the rinse liquid supply nozzle; and a controller configured to perform a control of the rotation mechanism, the supply from the developing solution supply nozzle, the supply from the water-based cleaning liquid supply nozzle, the supply from the aqueous solution supply nozzle, the supply from the rinse liquid supply nozzle, and the moving mechanism, the controller being configured to perform a control of executing:

(A) supplying the developing solution to the substrate and developing the resist film to form a resist pattern;

(B) supplying the water-based cleaning liquid to the developed substrate to clean the substrate with the water-based cleaning liquid;

(C) applying the aqueous solution of the water-soluble polymer to the substrate cleaned with the water-based cleaning liquid to form a hydrophilic layer having a hydrophilic property on a surface of the substrate; and (D) cleaning the substrate on which the hydrophilic layer has been formed, with the rinse liquid; and executing at the (B):

(a) accelerating a rotation speed of the substrate; and (b) after the (a), decelerating the rotation speed of the substrate until a start of the (C), wherein a deceleration in the (b) is lower than an acceleration in the (a).

(10) The developing treatment apparatus according to the (9), further including a gas supply nozzle configured to supply gas to the substrate held by the substrate holder, wherein:

the moving mechanism moves the gas supply nozzle; and the controller is configured to:

control a supply from the gas supply nozzle; and perform a control of executing at the (D):

(c) rotating the substrate while supplying the rinse liquid to the substrate on which the hydrophilic layer has been formed; and (d) after the (c), rotating the substrate in a state of not supplying the rinse liquid, to dry the substrate; and executing in the (d):

(m) accelerating the rotation speed of the substrate while supplying gas so as to form a recessed part in a film of the rinse liquid at a center on the substrate to spread the recessed part; and (n) after the (m), decelerating the rotation speed of the substrate according to a spread of the recessed part.

(11) The developing treatment apparatus according to the (10), wherein the controller is configured to perform a control of executing in the (c) at the (D):

(x) rotating the substrate while supplying a water-based rinse liquid to the substrate on which the hydrophilic layer has been formed; and (y) after the (x), rotating the substrate while supplying a surfactant-containing rinse liquid to the substrate; and in the (x), the substrate is rotated at a predetermined rotation speed, and then the rotation speed of the substrate is decelerated by an end of the (x), down to a rotation speed at a start of the (y) which is lower than a highest rotation speed in the (m).

According to this disclosure, it is possible to reduce the number of defects in the case of forming a resist film having a large contact angle with a rinse liquid.

What is claimed is:

1. A developing treatment method for performing a developing treatment on a resist film on a substrate, the developing treatment method comprising:

(A) supplying a developing solution to the substrate and developing the resist film to form a resist pattern;

(B) supplying a water-based cleaning liquid to the developed substrate to clean the substrate with the water-based cleaning liquid;

(C) applying an aqueous solution of a water-soluble polymer to the substrate cleaned with the water-based cleaning liquid to form a hydrophilic layer having a hydrophilic property on a surface of the substrate; and (D) cleaning the substrate on which the hydrophilic layer has been formed, with a rinse liquid, wherein the (D) comprises:

(c) rotating the substrate while supplying the rinse liquid to the substrate on which the hydrophilic layer has been formed; and (d) after the (c), rotating the substrate in a state of not supplying the rinse liquid, to dry the substrate, the (d) comprising:

(m) accelerating the rotation speed of the substrate while supplying gas so as to form a recessed part in a film of the rinse liquid at a center on the substrate to spread the recessed part; and (n) after the (m), decelerating the rotation speed of the substrate according to a spread of the recessed part and maintaining the decelerated rotation speed for a predetermined time.

2. The developing treatment method according to claim 1, wherein:

a highest rotation speed of the substrate in the (m) is 700 rpm or more and 1800 rpm or less; and the (n) decelerates the rotation speed of the substrate from the highest rotation speed of the substrate in the (m) down to a predetermined rotation speed of 600 rpm or more.

3. The developing treatment method according to claim 2, wherein:

the (c) at the (D) comprises:

(x) rotating the substrate while supplying a water-based rinse liquid to the substrate on which the hydrophilic layer has been formed; and (y) after the (x), rotating the substrate while supplying a surfactant-containing rinse liquid to the substrate; and in the (x), the substrate is rotated at a predetermined rotation speed, and then the rotation speed of the substrate is decelerated by an end of the (x), down to a rotation speed at a start of the (y) which is lower than a highest rotation speed in the (m).

4. The developing treatment method according to claim 1, wherein:

the (c) at the (D) comprises:

(x) rotating the substrate while supplying a water-based rinse liquid to the substrate on which the hydrophilic layer has been formed; and (y) after the (x), rotating the substrate while supplying a surfactant-containing rinse liquid to the substrate; and in the (x), the substrate is rotated at a predetermined rotation speed, and then the rotation speed of the substrate is decelerated by an end of the (x), down to a rotation speed at a start of the (y) which is lower than a highest rotation speed in the (m).

5. The developing treatment method according to claim 1, wherein the (C) comprises:

(e) rotating the substrate while supplying the aqueous solution of the water-soluble polymer to the substrate cleaned with the water-based cleaning liquid; and (f) after the (e), rotating the substrate in a state of not supplying the aqueous solution of the water-soluble polymer.

6. The developing treatment method according to claim 1, wherein a supply time of the water-based cleaning liquid at the (B) is longer than a supply time of the aqueous solution of the water-soluble polymer at the (C).

7. The developing treatment method according to claim 1, wherein a time from a stop of the supply of the water-based cleaning liquid at the (B) to a start of the supply of the aqueous solution of the water-soluble polymer at the (C) is 0.7 seconds or less.

8. The developing treatment method according to claim 1, wherein a highest rotation speed of the substrate in the (a) at the (B) is 700 rpm or more and 1800 rpm or less.

9. A developing treatment method for performing a developing treatment on a resist film on a substrate, the developing treatment method comprising:

(A) supplying a developing solution to the substrate and developing the resist film to form a resist pattern;

(B) supplying a water-based cleaning liquid to the developed substrate to clean the substrate with the water-based cleaning liquid;

(C) applying an aqueous solution of a water-soluble polymer to the substrate cleaned with the water-based cleaning liquid to form a hydrophilic layer having a hydrophilic property on a surface of the substrate; and (D) cleaning the substrate on which the hydrophilic layer has been formed, with a rinse liquid, the (B) comprising:

(a) accelerating a rotation speed of the substrate; and (b) after the (a), decelerating the rotation speed of the substrate until a start of the (C), and the (C) comprising:

(e) rotating the substrate while supplying the aqueous solution of the water-soluble polymer to the substrate cleaned with the water-based cleaning liquid; and after the (e), maintaining a rotation of the substrate in a state of not supplying the aqueous solution of the water-soluble polymer, wherein the aqueous solution of the water-soluble polymer and the rinse liquid are acidic, and wherein an execution time of the maintaining the rotation is longer than an execution time of the (e).

10. The developing treatment method according to claim 9, wherein a supply time of the water-based cleaning liquid at the (B) is longer than a supply time of the aqueous solution of the water-soluble polymer at the (C).

11. The developing treatment method according to claim 9, wherein a time from a stop of the supply of the water-based cleaning liquid at the (B) to a start of the supply of the aqueous solution of the water-soluble polymer at the (C) is 0.7 seconds or less.

12. The developing treatment method according to claim 9, wherein a highest rotation speed of the substrate in the (a) at the (B) is 700 rpm or more and 1800 rpm or less.

* * * * *